(12) United States Patent
Fung et al.

(10) Patent No.: US 6,215,685 B1
(45) Date of Patent: Apr. 10, 2001

(54) SEQUENTIALLY COMPARING CONTENT ADDRESSABLE MEMORY

(75) Inventors: Pak Kuen Fung, Plano; Heip Van Tran, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/201,556

(22) Filed: Nov. 30, 1998

(51) Int. Cl.[7] ............................................ G11C 15/00
(52) U.S. Cl. ........................................ 365/49; 711/108
(58) Field of Search ............................. 365/119, 189.07; 711/108

(56) References Cited

U.S. PATENT DOCUMENTS

| | | | |
|---|---|---|---|
| 4,622,653 | * 11/1986 | McElroy | 365/49 |
| 5,359,564 | * 10/1994 | Liu et al. | 365/49 |
| 5,467,349 | * 11/1995 | Huey et al. | 711/108 |
| 5,513,134 | * 4/1996 | Cooperman et al. | 365/49 |
| 5,517,441 | * 5/1996 | Dietz et al. | 365/49 |
| 6,055,234 | * 4/2000 | Aramaki | 711/108 |

OTHER PUBLICATIONS

Betty Prince, et al., *Semiconductor Memories*, A Handbook of Design, Manufacture and Applications, Second Edition, Basic Memory Architecture and Cell Structure, 5.3 Data Storage Elements, pp. 152–154.

* cited by examiner

Primary Examiner—Tan T. Nguyen
(74) Attorney, Agent, or Firm—J. Dennis Moore; Wade James Brady, III; Frederick J. Telecky, J (57) ABSTRACT

A content addressable memory (CAM) (30) and a method of using it to sequentially match tags stored in the CAM to a target tag. The CAM (30) has a tag memory (20) comprised of tag cells (10, 10a) and also has a data cache. Each tag cell (10, 10a) is structured like a conventional RAM cell for storing a bit of data but also has a multiplexing switch (16) at its output. The multiplexing switch (16) applies a signal representing the tag cell's contents to a readline (15). A tag compare circuit (25) external to tag memory (20). On each readline, tag compare circuit (25) compares a bit from each cell (10, 10a) in a selected column to a bit of the target address. This cycle is repeated for all bits of the target address and successive columns of the tag memory unless terminated by a mismatch for all cells (10, 10a) in a column. The tag compare circuit (25) has logic circuitry that maintains a "hit" output signal.

29 Claims, 6 Drawing Sheets

SEQUENTIALLY COMPARING CONTENT ADDRESSABLE MEMORY

TECHNICAL FIELD OF THE INVENTION

The present invention relates generally to computer memories, and more particularly to a memory cache configuration and a method of searching the cache for matches.

BACKGROUND OF THE INVENTION

"Content-addressable memories" (CAMS) are used in memory cache systems. They perform a matching process that determines whether the cache contains data needed elsewhere in the system, such as data requested a processor.

With a general purpose computer that uses a CAM, as with all cache systems, when a processor identifies the data it needs, the CAM must check its memory to determine if the identified data is located in the CAM. In other words, it determines whether the data is a cache entry or whether it is stored only in main (non-cache) memory. With the CAM approach, this checking process is performed. by storing "tags", each of which may be part of the address of each cache entry, in the CAM. The CAM compares each tag to a "target tag" issued by the processor. If there is a match, the data is located in the CAM. If not, the data is fetched from main memory.

Conventional CAMs simultaneously compare the target tag to every bit of all tags. They accomplish this comparison by using special tag memory cells ("tag cells"). Each tag cell is like a conventional RAM cell, with an associated bitline and wordline and data storage components, but also has a comparator. The comparator compares a signal on a bitline to the cell's contents and places the result on a readline. The comparators of all cells in the CAM are turned on at once so that each cell may perform its comparison at the same time as all other cells.

Figure 1:
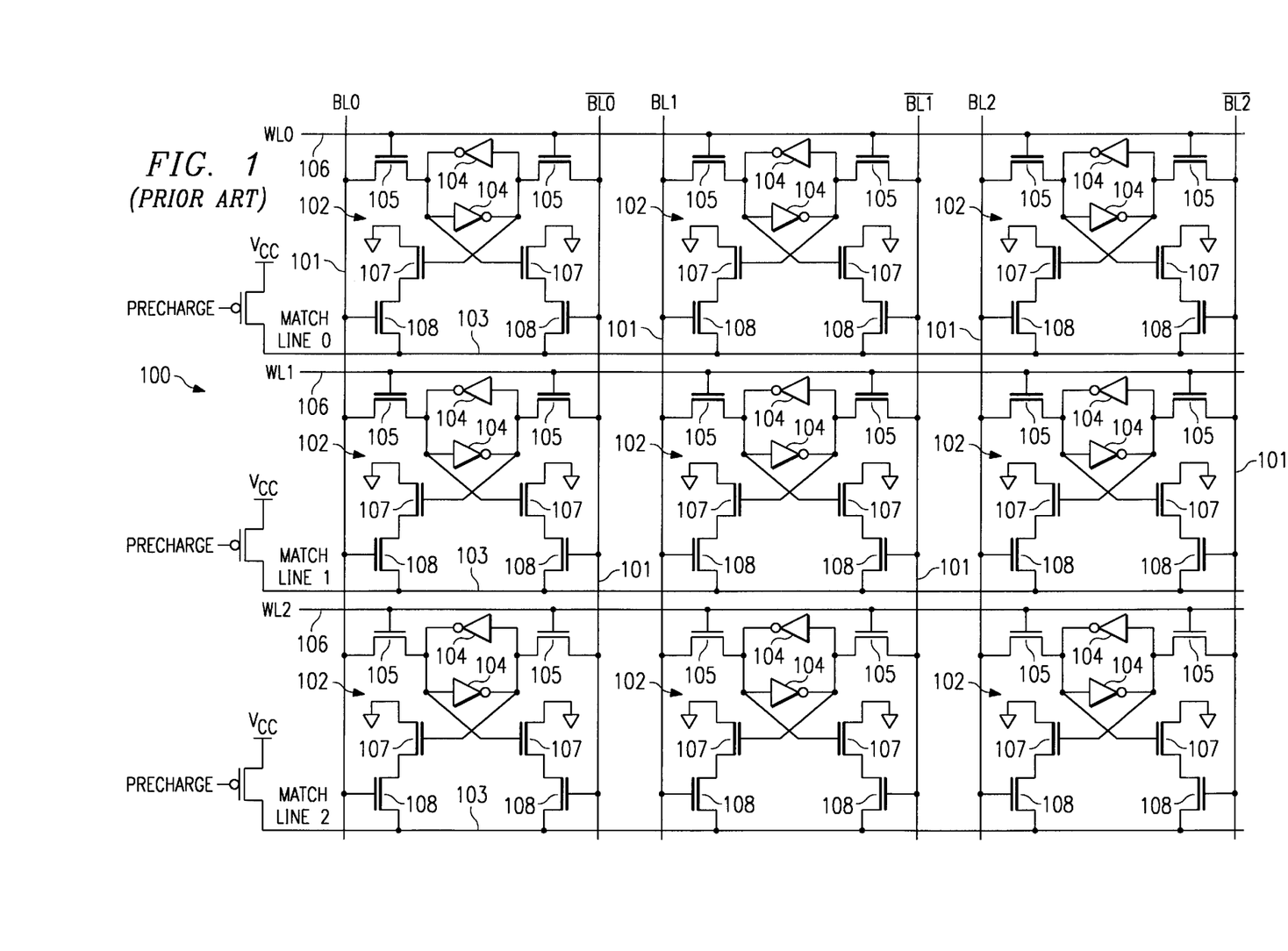
FIG. 1 illustrates a prior art CAM (content addressable memory).

FIG. 1 illustrates a prior art CAM 100 that has a comparator (switches 107 and 108) for each tag cell 102. Bitlines 101 carry consecutive bits of the target tag (and the complementary bits) simultaneously to the cells 102. Each bit of the target tag is compared to the contents of the cells 102 as indicated by the state of a pair of inverters 104. Each row of cells 102 has an associated matchline 103, which is precharged to Vcc. Switches 105 are activated by wordlines 106. A pair of series-connected switching transistors 107 and 108 are controlled by the output of each inverter 104. Switching transistors 107 and 108 connect matchline 103 to ground and must both be activated to discharge matchline 103. This discharge will occur only when the cell contents do not match the target tag bit on the bitline. Thus, for each row, the matchline 103 goes low when there is a mismatch. If the matchline of any row remains at Vcc, a match on that row is indicated. An OR gate (not shown) may be used to provide a global hit signal from the CAM 100.

This conventional method of configuring and simultaneously comparing contents of tag cells of a CAM is costly in terms of die area and the resulting current spike in the power supply. For CAMs that store a large number of entries, such as those used in packet communication systems, the current spikes can cause problems.

SUMMARY OF THE INVENTION

One aspect of the invention is a content addressable memory (CAM) that stores tags and data associated with each tag and sequentially compares the tags to a target tag. The CAM comprises an array of tag cells and an array of data cells. Each tag cell has appropriate memory storage components for storing a bit of data and also has a multiplexing switch whose output is a signal representing the state of the bit stored in the cell. A bit-select line connects each column of tag cells and a readline connects each row of tag cells. A tag compare circuit is external to the tag cells. Any bit-select line can be activated to turn on the multiplexing switches in a column of the array. Then, the tag compare circuit compares the bits in the cells of that column to a bit of the target tag. As each bit of the target tag is compared to successive columns of tag cell outputs, the tag compare circuit maintains readline outputs that each indicate whether the comparisons for cells on a row so far indicate a match or a mismatch. These readline outputs can be tied to each other to provide a "hit" signal. Advantages of the invention are that the area of each tag cell, and hence the size of the CAM, are reduced. This is due to the fact that each tag cell has only a multiplexing switch (one or two transistors) at its output rather than a comparator. When an array of such cells is considered, the area savings is significant.

The CAM also reduces current spikes. At any one time, only one bit of the target address is compared to bits from a column of tag cells.

A further advantage is that the CAM may be easily programmed to accommodate target tags having varying lengths. Thus, for shorter target tags, the CAM may be programmed in a manner that requires less time to determine if there is a match.

The above features are especially attractive for CAMs used for packet switching, such as asynchronous transfer mode (ATM) switches. These switches perform address substitutions, using CAMs that have a large number of addresses, typically 1 K or more. In such CAMs, the array size and current spikes associated with conventional CAMs are an even greater problem than with smaller CAMs.

The programmability aspect of the invention may be extended to partitioning the CAM into sections that may be disabled or enabled during tag matching. This permits users to further reduce power and increase speed as dictated by the sections of the CAM that are actually being used.

DETAILED DESCRIPTION OF THE INVENTION

Figure 2:
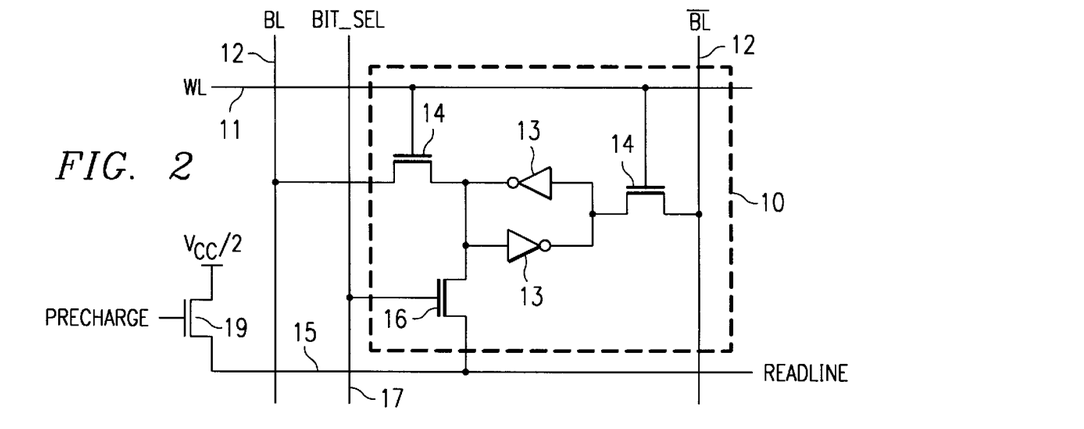
FIG. 2 illustrates a tag cell of a CAM in accordance with the invention.

FIG. 2 illustrates a tag memory cell ("tag cell") 10 of a CAM (content-addressable memory), configured in accordance with the invention. As explained below in connection with FIG. 6, a CAM in accordance with the invention has an array of cells such as tag cell 10. A "tag" as used herein may be any digital identifier (one or more bits) for data associated with the tag. When a target tag is matched to a tag in the CAM, the CAM provides the data associated with that tag.

Like a cell of a RAM (random access memory), tag cell 10 stores a single bit, typically in a static memory cell as shown here. A wordline (WL) 11 and complementary bit-lines (BL and EL) 12 are used for writing to cell 10. A pair of inverters 13 and associated input switching transistors 14 determine the binary state of the bit stored in cell 10. In the example shown, transistors 14 are NMOS transistors, though others could be used and the output voltage of the upper inverter 13 can be taken as determining the bit stored.

For tag matching, a readline 15 receives a signal indicating the state of the bit stored in cell 10. Thus, unlike a conventional tag cell, cell 10 does not perform a comparison to provide output on the readline. Instead, cell 10 has a multiplexing transistor 16 that, when on, couples the cell's stored contents to the readline 15. Cell 10 thereby provides a "tagbit output" signal that indicates the stored "0" or "1" state of the cell at the output terminal ("test terminal") of multiplexing transistor 16. The test terminal of each cell 10 is coupled to the readline 15 of that cell's row. Multiplexing transistor 16 has a bit-select input that couples the test terminal to the tagbit output of cell 10 when the bit-select line 17 is activated.

A bit-select line (BIT_SEL) 17 is connected to cell 10 and runs parallel to the bitlines 12. In operation for tag matching, a precharge transistor 19 is used to precharge readline 15 to a voltage intermediate between logical 1 (Vcc volts) and 0 (0 volts), such as Vcc/2. When bit-select line 17 is activated by a "1" (Vcc volts), transistor 16 conducts, driving the voltage on the precharged readline 15 towards 0 or Vcc depending on whether the stored bit is a "0" or a "1". As explained below in connection with FIG. 6, this bit-indicating signal on the readline 15 is compared to a signal representing a bit of a target tag.

Figure 3:
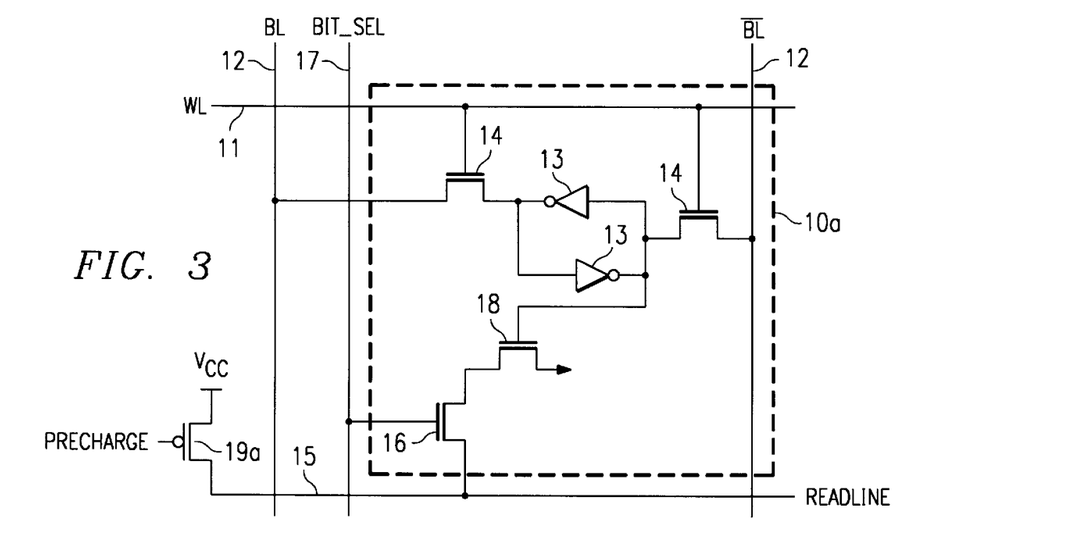
FIG. 3 illustrates an alternative embodiment of a tag cell in accordance with the invention.

FIG. 3 illustrates a CAM cell 10a, which is an alternative embodiment of CAM cell 10. Cell 10a is like cell 10 but has its readline 15 precharged to Vcc. A precharge transistor 19a may be a PMOS transistor rather than an NMOS transistor to enhance precharging to Vcc.

The multiplexing switch of cell 10a is comprised of two transistors 16 and 18. Transistor 18 provides a high input impedance to the cell output and cooperates with transistor 16 to drive readline 15 to a voltage of 0 or Vcc, depending on whether the stored bit is "0" or "1". The additional transistor 18 provides a more robust signal on the readline 15 and may eliminate the need for sense amps on the readlines 15 (see elements 25a of FIG. 6).

Referring to both FIGS. 2 and 3, both tag cell embodiments, cell 10 and cell 10a, use a multiplexing switch to apply a signal indicating the stored bit (the tagbit output) to the readline 15. In the case of cell 10, this switch is a single transistor 16, whereas in the case of cell 10a, this switch is two transistors 16 and 18. In either case, the number of transistors is less than would be required for a tag cell of conventional CAM, which has a comparator.

Figure 4:
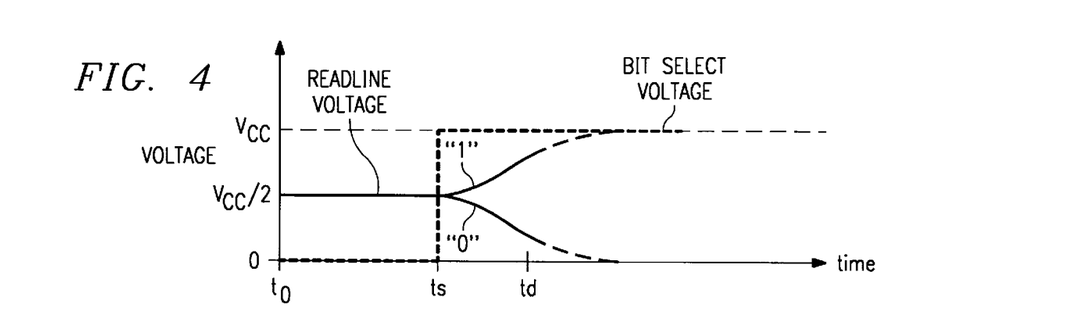
FIGS. 4 and 5 are timing diagrams for the tag cells of FIGS. 2 and 3, respectively.
Figure 5:
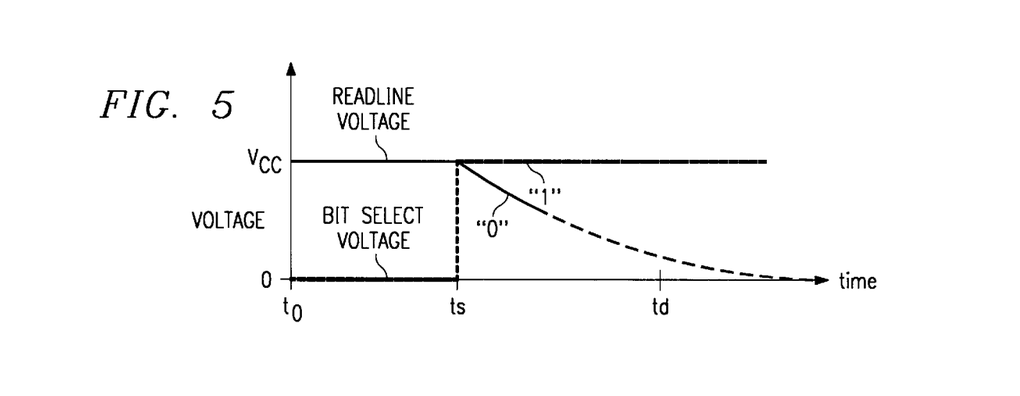

FIGS. 4 and 5 are timing diagrams of CAM cells 10 and 10a, respectively. In both cases, at time to, the cell is initially pre-charged, such that the readline voltage is Vcc/2 in the case of cell 10 and Vcc in the case of cell 10a. The bit-select voltage is low (v=0). When the cell is switched, at $t_s$, the bit-select voltage is high (Vcc). In the case of cell 10 (FIG. 4), the readline voltage goes from its pre-charge level to Vcc or 0 indicating a logical "1" or "0", respectively. In the case of cell 10a(FIG. 5), the readline voltage remains at Vcc or goes to 0 indicating a logical "1" or "0", respectively. At time $t_d$, the cell is read, with cell 10 (FIG. 4) on a readline 15 having sense amps (see elements 25a of FIG. 6) to aid the readout and cell 10a (FIG. 5) having a transistor 18 that provides a more robust output signal.

Figure 6:
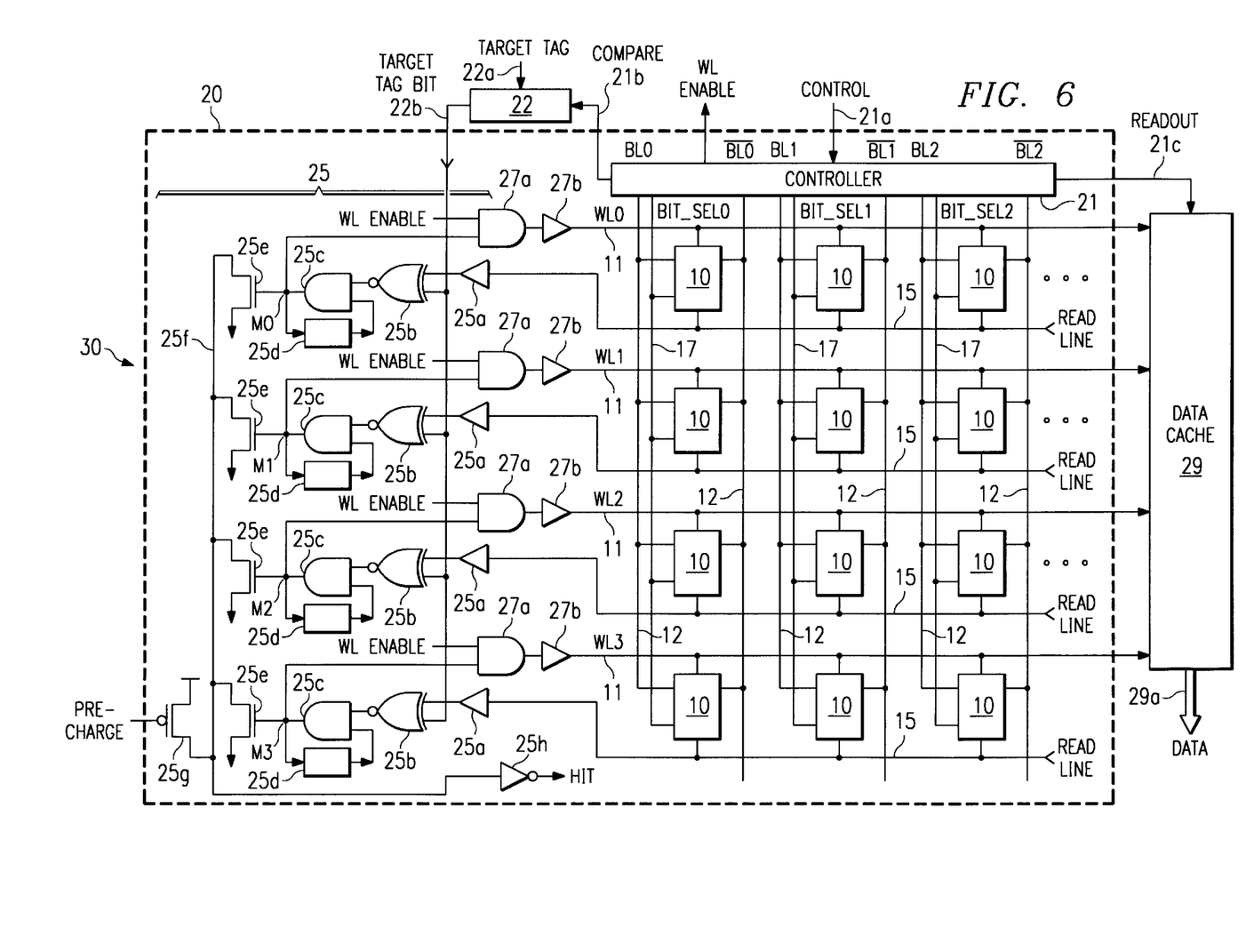
FIG. 6 illustrates a CAM in accordance with the invention.

FIG. 6 illustrates a CAM 30 having a tag memory 20 in data communication with a data cache 29 (typically an SRAM). Tag memory 20 comprises a number of rows and columns of tag cells 10 (or 10a). There are L number of rows and each row has M columns. As described above in connection with FIG. 2 (or 3), each tag cell 10 (or 10a) is coupled by an associated multiplexing switch 16 (or 16 and 18) to a corresponding readline 15 for its row.

In the embodiment of FIG. 6, each tag is stored in tag cells 10 on the same wordline as the cached data associated with the tag. If a match is made to a tag on a particular wordline, the requested data on that wordline is retrieved from data cache 29. Thus, as illustrated, the wordlines (WL0, WL1, WL2 . . . ) of CAM 30 are directly connected from tag memory 20 to the data is cache 29. There are L rows of the data cache 29, each row having N data memory cells.

Generally, tag memory 20 will have at least as many columns as there are bits in the target tag to be compared, and as least as many rows as needed to accommodate tags for the cached data entries. For simplicity, in the tag memory 20 of FIG. 6, there are just four rows and three columns of tag cells 10. Wordlines 11 and readlines 15 connect rows of cells 10. Bitlines 12 and bit-select lines 17 connect columns of cells 10.

Controller 21 comprises circuitry that determines which bitline 12 or bit-select line 17 is active at any given time. It receives a control input (CONTROL) via a control line 21a from an external source, such as a switch controller of an ATM switch or a processor of a computer described below in connection with FIGS. 10 and 11, respectively. Controller 21 delivers a COMPARE signal via a compare line 21b to tagbit selector 22 and a READOUT signal via a readout line 21c to data cache 29.

Tagbit selector 22 stores a "target" tag. This target tag may be issued from either a remote source that is part of a data communications network or by a processor in a computer as described below in connection with FIGS. 10 and 11. The target tag is received into tagbit selector 22 via a tag input line 22a. In response to the COMPARE signal from controller 21, tagbit selector 22 sequentially selects one bit at a time of the target tag for comparison with a corresponding bit from the stored tags. Tagbit selector 22 has a tagbit output terminal and delivers the target tag bit to tag compare circuit 25 via a target tagbit line 22b.

Tag compare circuit 25 (25a, 25b, 25c, 25d, 25e) is located at the periphery of tag memory 20. In general, tag compare circuit 25 compares the selected bit of the target tag to the outputs of tag cells 10 in a column of tag memory 20 that is determined by activating a bitselect line 17. Thus, rather than comparing all tag bits at once to the target tag, only a single bit of each tag is compared to a selected bit of the target tag. For example, during a first clock, bit 0 of each tag is compared with bit 0 of the target tag. If there is a match for bit 0, during the next clock, bit 1 of each tag is compared to bit 1 of the target tag. This continues until a mismatch for a particular target tag bit is indicated or until the last bit of the target tag has been compared.

The tag compare circuit 25 is comprised of a sense amp 25a, XNOR gate 25b, AND gate 25c, flip-flop 25d, and switch 25e, one of each associated with each row of tag memory 20. During a first cycle of the tag-matching process, the multiplexing transistors 16 of a first column of tag memory 20 are turned on by means of their associated bit-select line 17. The signal on each readline 15 indicating the corresponding stored bit is amplified by a sense amp 25a into a corresponding-logical 1 or 0. In each row, an XNOR gate 25b has an input for the row input signal from the tag memory 20 on readline 15 and another input for the tagbit output from the tagbit selector 22. It compares these two signals, and in the first cycle, the comparison will be of the bits in the first column of tag memory 20 with the first bit of the tag. Then, in each row, AND gate 25c inputs the result of the comparison for storage in flip-flop 25d. Flip-flops 25d are each initialized to "1" to enable AND gate 25c, but once a "0" (mismatch) is stored in a flipflop 25d, the corresponding AND gate 25c is disabled and outputs a "0" (mismatch). Then, in the next cycle and in the same manner, the next bit of the target tag is compared to the bits of a next column. In each row where flip-flop 25d is still a "1" (indicating no mismatch yet), the results of this next comparison are stored in that row's flip-flop 25d.

In each row, if a mismatch occurs at XNOR gate 25b between a bit of the target tag and an output of a cell 10, XNOR gate 25b will output a logical "0" to AND gate 25c, which must then also output a "0" to flip-flop 25d. Once flip-flop 25d receives a "0", it locks AND gate 25c into outputting only "0". Thus, only a single bit mismatch in any row determines a mismatch for the target tag in that row. While the bits of the target tag are being sequentially compared, the output of AND gate 25c in each row indicates the cumulative results of the comparison (0=mismatch, 1=no mismatch yet) for that row so far.

The compare cycles are repeated for successive bits of the target tag and successive columns of tag memory 20. The compare process may be truncated if all AND gates 25c in a column indicate a mismatch, but will otherwise continue for all bits of the target tag.

Precharge line 25f is precharged to Vcc volts via PMOS transistor 25g. If line 25f holds the charge, that is, if all AND gates 25c in a column indicate a mismatch, then switch 25e is off and inverter 25h produces a "no hit" signal of "0". However, line 25f will be grounded if any switch 25e is in a row where there is a match, that is, where the output of the AND gate 25c is a "1" (Vcc volts). If line 25f is grounded by a match on a row, inverter 25h produces a "hit" signal of "1".

As stated above, in the embodiment of FIG. 6, the wordlines 11 of tag memory 20 are common to those of the data cache 29. For each row, a wordline enable AND gate 27a may be used to access the cached data associated with the tag for that row. Specifically, if a tag comparison process results in a match for a tag, the AND gate 25c on that tag's row will output a "s" to one input of AND gate 27a on that row. Setting the ENABLE signal at the other input of all AND gates 27a to "1" enables only AND gate 27a in the row with the match to generate a "1" (wordline enable signal). This signal is transmitted to data cache 29 via a corresponding buffer amplifier 27b, enabling readout from the data cache 29 of data at the proper address. A READOUT signal delivered from controller 21 via a readout line 21c determines the timing of the retrieval of data from data cache 29.

Each cycle of the tag comparing process of the present invention simultaneously compares one bit of the target tag to one bit of each tag stored in tag memory 20. This comparison is repeated for successive bits of the target tag. With respect to the target tag, the process is thus a "sequential tag comparing" process as opposed to the parallel tag comparing process of conventional CAMs. As compared to conventional CAMs, the number of simultaneous comparisons is reduced, smoothing current spikes.

The time required to detect a hit or miss is, at most, equal to the time to compare each bit of the target tag. However, because each row has its own tag comparing circuitry 25, this time remains the same regardless of the number of cache entries. This feature is important for applications of CAM 30 in an ATM (asynchronous transfer mode) switch, which is described below in connection with FIG. 10.

In the embodiment of FIG. 6, wordlines 11 and bitlines 12 are optional and are used in a conventional manner to write the one-bit contents of a cell 10. This permits the tags in tag memory 20 to be changed. For writing to a cell 10, its bit-select line 17 is disabled (held low). This prevents its multiplexing transistor 16 from interfering with writing. In other embodiments, the cell contents may be permanently stored, eliminating the need for wordlines 11 and bitlines 12. Similarly, although not explicitly illustrated in FIG. 6, data cache 29 may or may not be readable or writable by means of wordlines and bitlines.

In the embodiment of FIG. 6, tag memory 20 has bit-select lines 17 like those of the cells 10 and 10a of FIGS. 2 and 3. The multiplexing transistors 16 are controlled by means of these bit-select lines 17. However, in other embodiments, the multiplexing transistors 16 could be controlled by bitlines 12, which would then be bit-select lines used for tag comparing as well as bitlines used for conventional memory writing. In this case, readlines 15 would be precharged "high" during a write.

A tag memory 20 configured to a standard number of columns can be easily programmed to accommodate "short" target tags. For example, if the tag memory is configured for a target tag of 16 bits but the actual target tag is just 8 bits, only the bit-select lines 17 for those columns need be activated and only 8 compare cycles need be performed. This can be implemented with appropriate masking or other circuitry in controller 21. This programmability can be implemented as either factory or field (user) programmability. This programmability of tag lengths can be used to save power and match times for shorter tags.

Further savings in power usage and match times can be accomplished by disabling the components of tag compare circuit 25 associated with empty cache rows. For example, tag memory 20 might be capable of storing tags for 1 K cache rows. However, if the tag memory 20 is not full, sense amps 25a and logic elements 25b–25e associated with unused rows can be disabled.

Figure 7:
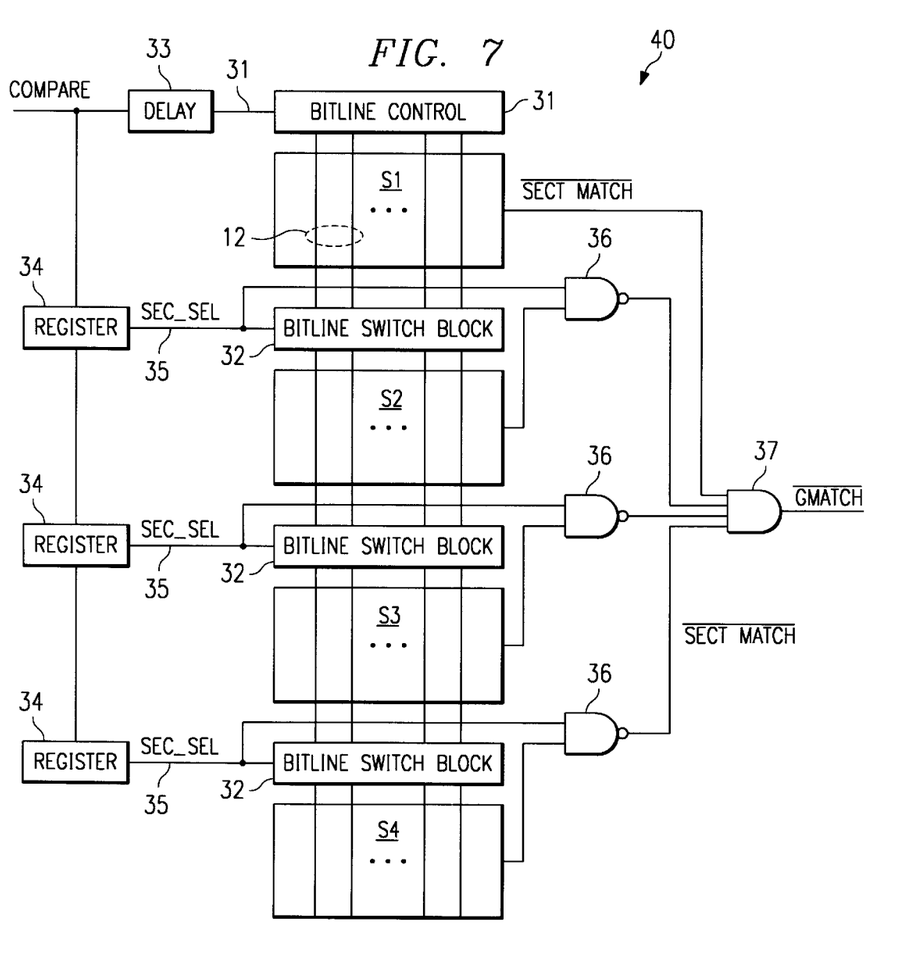
FIG. 7 illustrates a CAM partitioned in accordance with the invention.

As a specific implementation of enabling tag comparisons only for tags that are actually stored, a tag memory can be partitioned into sections. FIG. 7 illustrates a tag memory 40 partitioned in accordance with the invention. Each partition is comprised of tag cells 10 (or 10a). In the embodiment of FIG. 7, tag memory 40 does not use bit-select lines. Instead, as described above, it uses bitlines 12 to control the multiplexing switches of its cells. A tag memory that does use bit-select lines, such as tag memory 20, could be partitioned in the same manner as tag memory 40.

In the example of FIG. 7, tag memory 40 is partitioned into four sections, S1, S2, S3, and S4. It is assumed that one section will always be used, here the uppermost section, S1.

The bitlines 12 of tag memory 40 are controlled by a bitline control unit 31. If tag memory 40 were to have bit-select lines like those of tag memory 20, bitline control unit 31 could be like the controller 21 of FIG. 3. However, for tag memory 40, which does not use bit-select lines, bitline control unit 31 controls only bitlines 12.

The other sections of tag memory 40 (S2, S3, and S4) are used only if activated by a SEC_SEL signal on a section select line 35. A register 34 associated with each section determines the high or low state on the SEC_SEL line 35. Each of these sections has an associated bitline switch block 32, which determines whether the bitlines 12 for that section will be enabled.

Figure 8:
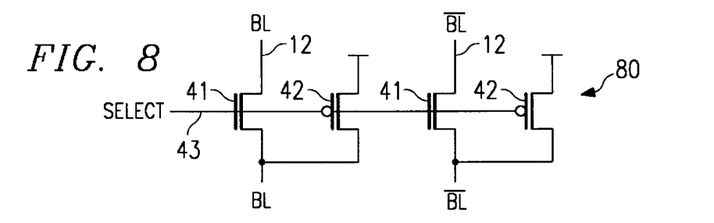
FIG. 8 illustrates passgates that may be used to implement the bitline switches of FIG. 7.
Figure 9:
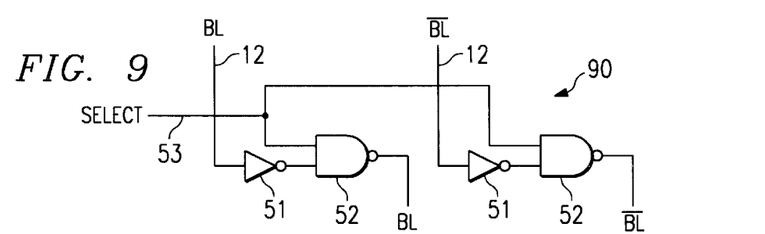
FIG. 9 illustrates repeaters that may be used to implement the bitline switches of FIG. 7.

FIGS. 8 and 9 illustrate a passgate 80 and repeater 90, respectively, suitable for use in bitline switch blocks 32. An advantage of using passgates 80 is that their use is simple. Using repeaters 90 results in a less resistive load on the bitlines 12 and less likelihood of an adverse effect on write operations. With a repeater 90, the bitline signal is regenerated at every section to ensure that writes can be performed.

Passgate 80 has two NMOS transistors 41 and two PMOS transistors 42. The gates of each transistor 41 and 42 are connected in series to a select line 43, such as SEC_SEL line 35 of FIG. 7. The drains and sources of NMOS transistors 41 are connected to BL and $\overline{BL}$, respectively. BL and $\overline{BL}$ are bitlines 12 of FIG. 7. The drains of PMOS transistors 42 are connected to Vcc and their sources are connected to the source output of NMOS transistors 41. When the select line 43 is "high", NMOS transistors 41 permit current to flow through BL and $\overline{BL}$. When the select line is "low" the drain node of the BL and $\overline{BL}$ are pulled to Vcc and bitline 12 is inactive.

Repeater 90 has two invertors 51 and two NAND gates 52. A select line 53 is connected to the input of each NAND gate 52. The BL and $\overline{BL}$ lines (bitlines 12) are each connected at the input of a different inverter 51. The output of each inverter 51 is an input to a NAND gate 52. When the select line 53 is high, NAND gates 52 act as invertors and the signal into invertors 51 is the same as the signal out of NAND gates 52. When the select line 53 is low, the outputs of NAND gates 52 are high and the EL and $\overline{BL}$ lines are taken to Vcc.

Referring again to FIG. 7, for each section of a partitioned tag memory 40, the SEC_SEL signal is also delivered to a NAND gate 36, where it is NAND'd with the output of the section to form a $\overline{SEC\_MATCH}$ signal. If a section is not activated, the $\overline{SEC\_MATCH}$ signal is set high. The $\overline{SEC\_MATCH}$ signals are delivered to AND gate 37 to form a global match signal, $\overline{GMATCH}$.

Figure 10:
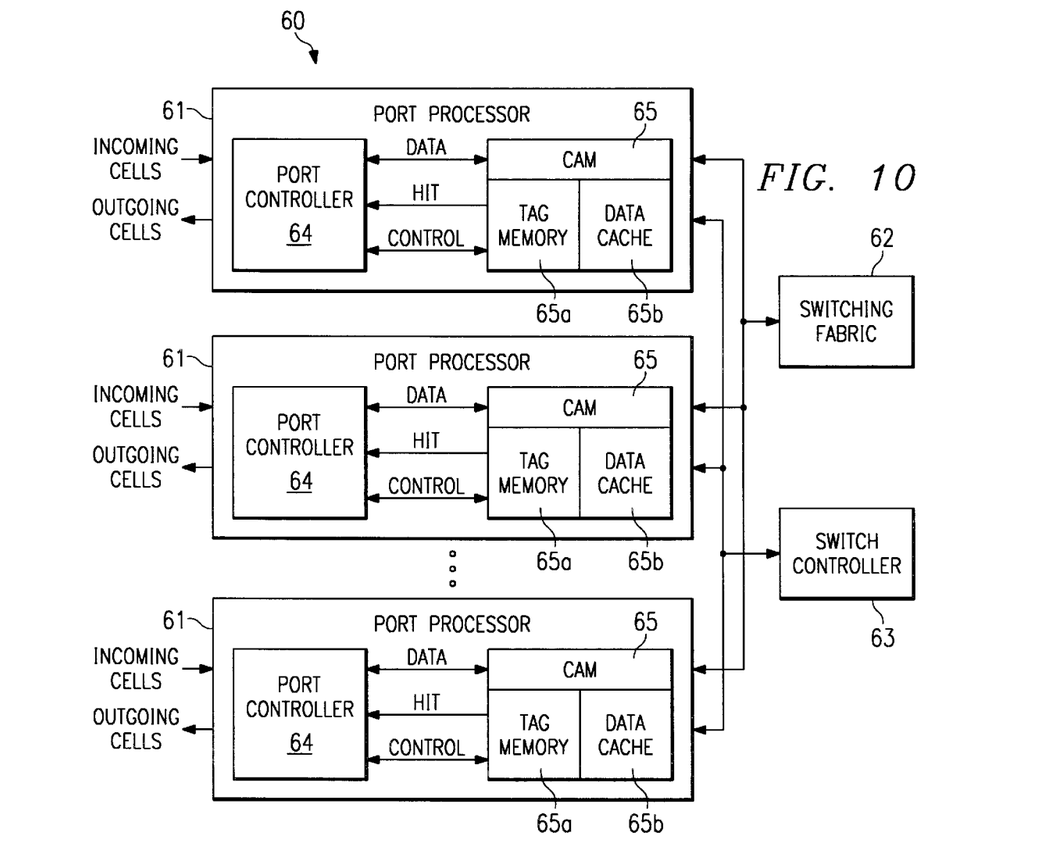
FIG. 10 illustrates how a CAM in accordance with the invention may be used in an asynchronous transfer mode (ATM) switch.

FIG. 10 illustrates an ATM (asynchronous transfer mode) switch 60 having a number of port processors 61, each having a CAM 65 in accordance with the invention. ATM switch 60 is part of a data communications system, in which computers or other sending and receiving stations (herein referred to as network "nodes") exchange data. As explained below, the general operation of switch 60 is to receive ATM cells from a source node and route them to the proper destination node.

Each ATM cell is a 53-byte block of data, comprising a 5-byte header and a payload of 48 bytes of information. ATM cells from various nodes are multiplexed as a single flow. This multiplexing occurs via asynchronous transfer, which means that cells are transmitted only when there is data to send and there is no need for dummy bytes as in time-division multiplexing. Also, ATM switching is connection-oriented, such that a connection between any two nodes must be established before data transfer can occur. The connection process results in the specification of a transmission path and a destination node, which enables the header in an ATM cell to be used to route the cell on the required path.

Each ATM cell is received into an input port processor 61 and routed by switch 60 to the proper output port processor 61. Because the length of each cell is fixed and the position of information in each cell's header is known, switching can be accomplished with the use of hardware. Thus, switch 60 may be implemented with logic circuitry. This circuitry performs in accordance with physical layer and ATM layer protocols. The physical layer protocol is not defined specifically for ATM switching but rather ATM relies on physical layers defined in other network protocols. This permits ATM to be supported by a wide range of physical media. The ATM layer is an interface between the physical layer and the "top" ATM layer, the ATM adaptation layer. In general, switch 60 determines where incoming cells are routed and multiplexes cells by placing them from individual connections into a single cell stream.

For ATM switching, the tags stored in CAM 65 may have a size corresponding to the complete number of bytes allocated for a VPI (virtual path identifier) and VCI (virtual channel identifier) in accordance with ATM standards. Or, the tags may have a size that is some portion thereof depending on how many paths and channels of paths are active for a particular switch 60.

In addition to port processors 61, switch 60 has a switching fabric 62 and a switch controller 63. ATM cells may enter switch 60 at any one port processor 61 and exit switch 60 from the same or another port processor 61. Switching fabric 62 handles switching between port processors 61 by mapping input ports to output ports. The switching process is performed under the control of switch controller 63.

Each port processor 61 is comprised of a port controller 64, which may be a state machine or other logic circuitry. Port controller 64 extracts cell header information (the target tag) from an incoming cell and delivers the target tag to CAM 65. CAM 65 is comprised of a tag memory 65a and data cache 65b, and has structure and operation equivalent to the CAM 30 described above in connection with FIG. 6. The functions of controller 21 of FIG. 6 may be handled by port controller 64.

Port controller 64 delivers the target tag to tag memory 65a. This target tag is sequentially compared to tags stored in tag memory 65a in the manner described above. When there is a "hit", a new address from data cache 65b is delivered to port controller 64. This new address indicates the proper port processor 61 from which the cell will exit switch 60. Port controller 64 substitutes the new address for the old address in the cell and delivers the cell to the switching fabric 62. Switching fabric 62 then routes the cell to the appropriate output port processor 61. When there is no "hit", switch 60 performs in accordance with ATM protocol. This protocol may permit the cell to simply be thrown away.

Figure 11:
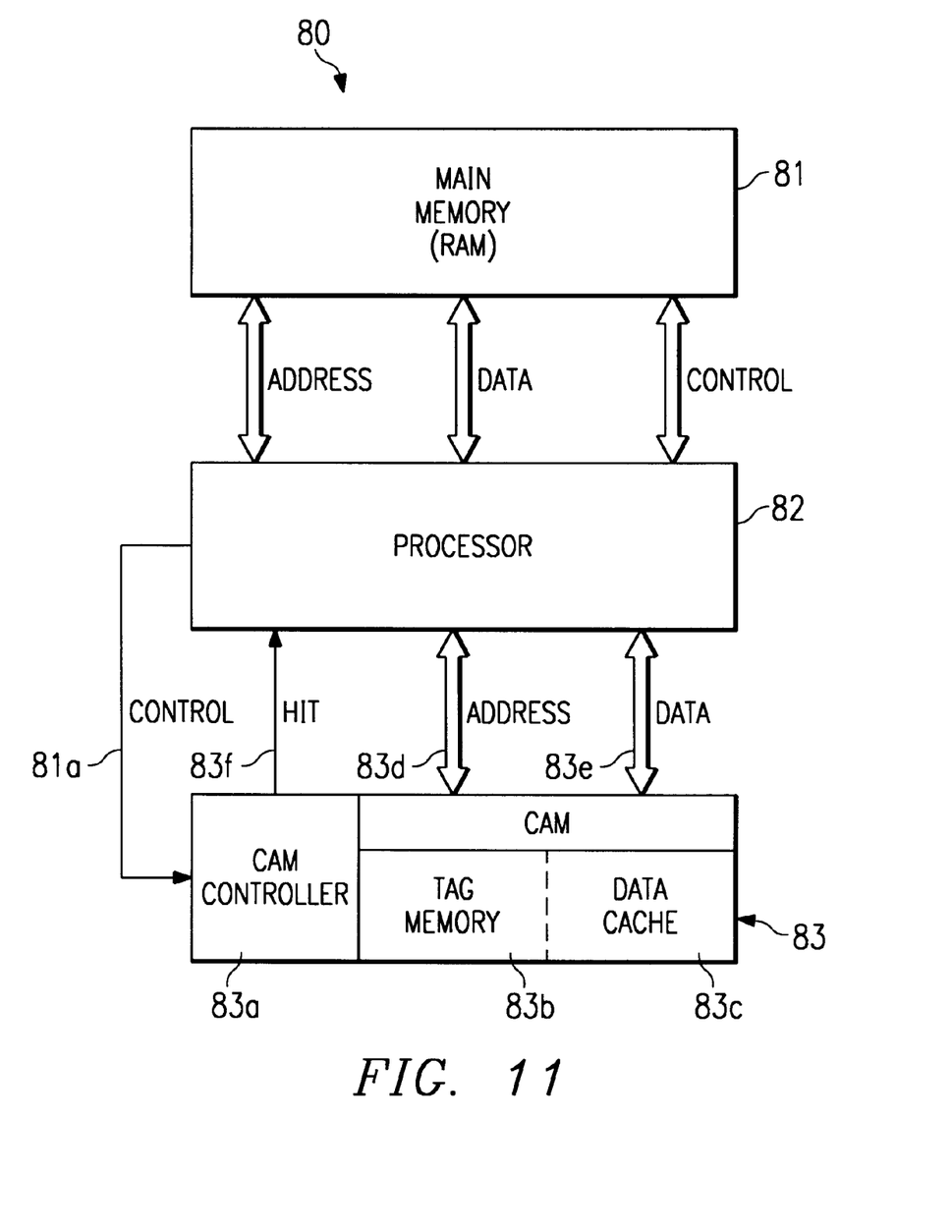
FIG. 11 illustrates how a CAM in accordance with the invention may be used in a general purpose computer.

FIG. 11 illustrates another application of the invention, a general purpose computer 80 having a CAM 83 in accordance with the invention. Apart from CAM 83, computer 80 may be configured in a manner similar to conventional general purpose personal computers or workstations. A processor 82 is programmed according to machine executable instructions to access a main memory 81 (typically random access memory) for instructions and data. This access is via conventional address, data, and control busses.

To assist in fetching data more expeditiously, CAM 83 attempts to match target tags issued by processor 82 to tags stored in the CAM 83. CAM 83 is configured like CAM 30 of FIG. 6 and operates in the same manner to sequentially match the target tag to tags stored in tag memory 83b. CAM 83 has a controller 83a, which may be a state machine or other logic circuitry, and which operates under the direction of processor 81 by means of control signals delivered via a control line 81a. The target tag is received via address bus 83d into tag memory 83b.

The tag matching process results in a binary "hit" signal on a hit line 83f, whose logic level indicates either a hit or no hit. If a hit is indicated, CAM 83 delivers data corresponding to the matched tag to processor 81 via a data bus 83e. As used in computer 80, CAM 83 may store more than one tag that matches the target tag and thus there may be more than one hit per target tag. If there is no hit, processor 81 may be programmed to take some appropriate action, such as delivering a message to whatever programming is currently being executed.

For both ATM switch 60 and computer 80, and as described above in connection with FIG. 6, each tag in tag memory 65a (or 83b) may be stored on the same wordline as its associated cached data in data cache (65b) (or 83c) so as to facilitate access to the cached data after a hit.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A content addressable memory (CAM) that stores tags and data associated with each tag and sequentially compares the tags to a target tag, comprising:

a data cache operable to store data associated with each tag;

a tag memory having rows and columns of tag cells, each tag cell operable to store a bit of a tag and having a multiplexing switch that receives a cell output signal representing the bit;

a number of bit-select lines, each of the bit-select lines connecting cells of one of the columns and operable to activate the multiplexing switches of those cells;

a number of readlines, each of the readlines connecting cells of a row and operable to receive a cell output signal from a cell of that row via the cell's associated multiplexing switch;

a tag compare circuit operable to receive cell output signals via each readline and to compare a cell output signal on each readline with a signal representing a bit of the target tag;

a target tag line operable to sequentially deliver bits of the target tag to the tag compare circuit;

a hit line operable to indicate the results of comparisons made by the tag compare circuit;

a data bus operable to output data from the data cache when a tag is matched to the target tag; and a controller having a control input for receiving control signals, and operable to activate the bit-select lines and to generate a readout signal to activate the data cache such that data associated with a matched tag may be retrieved.

2. The CAM of claim 1, wherein each multiplexing switch is comprised of a single transistor.

3. The CAM of claim 1, wherein each multiplexing switch is comprised of two transistors, with the first transistor providing high input impedance to the second transistor.

4. The CAM of claim 1, further comprising a tagbit selector operable to store the target tag, to sequentially select bits of the target tag, and to deliver these bits to the tag compare circuit.

5. The CAM of claim 1, further comprising logic circuitry associated with the bit-select lines operable to activate a programmed number of bit-select lines.

6. The CAM of claim 1, wherein the tag compare circuit is comprised of a series connected XNOR gate, AND gate, and flip-flop at the output of each readline.

7. The CAM of claim 1, wherein the tag memory further comprises a number of wordlines, each of the wordlines connecting cells of one of the rows, and a number of bitlines, each of the bitlines connecting cells of one of the columns, such that the wordlines and bitlines are operable to select cells for writing to the cells.

8. The CAM of claim 1, wherein the bit-select lines are bitlines further operable to select cells for writing to the cells.

9. The CAM of claim 1, wherein the data cache stores row of data and has a wordline associated with each row and wherein wordlines of the tag memory are each connected to a wordline of the data cache whose memory cells store data for the tag on that row.

10. A CAM digital memory for use with LOW and HIGH voltages respectively indicating logical "0" or "1" signals, comprising:

a memory array arranged in L rows and (M+N) columns, each row having M tag cells and N data memory cells, each tag cell having (i) a memory cell having a tagbit output indicated a stored "0" or "1" signal, (ii) a test terminal, and (iii) a normally open multiplexing switch having a bit-select input for coupling the test terminal to the tagbit output only when the bit-select signal receives a "1" signal;

a readline for each row, coupled to the test terminal of each tag cell in its row;

a bit-select line for each column, coupled to the bit-select terminal of each tag cell in its column for closing that column's multiplexing switches via a "1" signal on the bit-select line;

a controller having a CONTROL input for receiving control signals and coupled to the memory array and bit-select lines, for generating COMPARE and READ-OUT signals;

a tagbit selector having (i) a tag input for receiving an M bit target tag signal, and (ii) a tagbit output coupled to the controller and responsive to the COMPARE signal to serially output the bits of the target tag signal to the tagbit output;

a tag compare circuit, having (i) a tagbit input coupled to the tagbit selector's output, (ii) L row inputs, each coupled to a respective readline, and (iii) a HIT output, coupled to the controller and responsive to the COMPARE signal to successively compare each tagbit received at the tagbit input simultaneously with all bits of the same column received from the readlines and generating a "1" at the HIT output if all the M tag cells in some row match the target tag; and an N bit data output, coupled to the memory array, row comparator, and controller, responsive to the READ-OUT signal to output the bits stored in the corresponding N data memory cells of the row whose tag matches the target tag.

11. The CAM of claim 10, wherein each multiplexing switch is comprised of a single transistor.

12. The CAM of claim 10, wherein each multiplexing switch is comprised of two transistors, with the first transistor providing high input impedance to the second transistor.

13. The CAM of claim 10, further comprising logic circuitry associated with the bit-select lines operable to activate a programmed number of bit-select lines.

14. The CAM of claim 10, wherein the tag compare circuit is comprised of a series connected XNOR gate, AND gate, and flip-flop at the output of each readline.

15. The CAM of claim 10, wherein the memory array further comprises a number of wordlines, each of the wordlines connecting cells of one of the rows, and a number of bitlines, each of the bitlines connecting cells of one of the columns, such that the wordlines and bitlines are operable to select cells for writing to the cells.

16. The CAM of claim 10, wherein the bit-select lines are bitlines further operable to select cells for writing to the cells.

17. A method of sequentially comparing a target tag to tags stored in a tag memory portion of a content addressable memory (CAM), comprising the steps of:
  selecting a bit of the target address;
  selecting a column of the tag memory, thereby providing a selected column;
  for each cell in the selected column, applying a signal representing the contents of each cell in the column to a readline associated with the cell;
  comparing each signal on the readlines to a signal representing the bit selected from the target address;
  providing the results of the comparing step as an output on each readline;
  repeating the above steps for each bit of the tag and successive columns of the tag memory; and
  providing a hit signal indicating the results of the comparing steps.

18. The method of claim 17, wherein the selecting step is performed by activating a bit-select line associated with each column.

19. The method of claim 17, wherein the selecting step is performed by activating a bitline associated with each column.

20. The method of claim 17, further comprising the step of accessing a data memory portion of the CAM in response to the comparing steps such that a row of the data memory on the same row as a matched tag is accessed.

21. The method of claim 17, further comprising the step of partitioning said tag memory such that said applying step occurs only for rows of selected partitions.

22. A method of using a content addressable memory (CAM) that stores tags and data associated with each tag and compares the tags to a target tag, comprising the steps of:
  partitioning a tag memory portion of the CAM into sections, the tag memory having tag cells that each store a bit of a tag, and the tag memory being arranged in rows and columns of the tag cells;
  receiving a target address;
  disabling any of the sections not storing a tag, thereby providing one or more enabled sections of the tag memory; and
  sequentially comparing bits of the target tag to bits of tags stored in columns of the enabled sections using a tag compare circuit external to the memory cells of the tag memory.

23. The method of claim 22, wherein the comparing step is performed by activating a bit-select line associated with each column such that output for each cell in that column is provided on a readline.

24. The method of claim 22, wherein the comparing step is performed by activating a bitline associated with each column such that output for each cell in that column is provided on a readline.

25. The method of claim 22, further comprising the step of accessing a data memory portion of the CAM in response to the comparing step such that a row of the data memory on the same row as a matched tag is accessed.

26. An asynchronous transfer mode (ATM) switch that routes ATM cells, each cell having header data and payload data, comprising:
  a number of port processors, each port processor having a port controller, an input port, an output port, and a content addressable memory (CAM), the port processor operable to extract a target tag from the header data, the CAM having a tag memory with rows and columns of tag cells and a data cache and the CAM operable to sequentially compare bits of the target tag to bits of tags stored in the tag cells, using a tag compare circuit that is external to the tag cells;
  a switching fabric operable to switch cells from an input port processor to an output port processor; and
  a switch controller that delivers control signals to the port processors.

27. The ATM switch of claim 26, wherein each tag cell has a multiplexing switch that receives a cell output signal representing the bit, and wherein the tag memory has (i) a number of bit-select lines, each of the bit-select lines connecting cells of one of the columns and operable to activate the multiplexing switches of those cells, (ii) a number of readlines, each of the readlines connecting cells of a row and operable to receive a cell output signal from a cell of that row via the cell's associated multiplexing switch, (iii) a tag compare circuit operable to receive cell output signals via each readline and to compare a cell output signal on each readline with a signal representing a bit of the target tag, (iv) a target tag line operable to sequentially deliver bits of the target tag to the tag compare circuit, (v) a hit line operable to indicate the results of comparisons made by the tag compare circuit, and (vii) a data bus operable to output data from the data cache when a tag is matched to the target tag.

28. A computer that uses caching to facilitate access to data, comprising:
  a processor operable to execute instructions representing a computer program;
  a main memory in communication with the processor operable to store instructions and data accessed by the processor; and
  a content addressable memory (CAM) in communication with the processor, operable to receive a target tag from the processor, the CAM having a tag memory with rows and columns of tag cells and also having a data cache, and the CAM operable to sequentially compare bits of the target tag to bits of tags stored in the memory cells, using a tag compare circuit that is external to memory cells, and operable to deliver data from the data cache if the compares result in a match.

29. The computer of claim 28, wherein each tag cell has a multiplexing switch that receives a cell output signal representing the bit, and wherein the tag memory has (i) a number of bit-select lines, each of the bitselect lines connecting cells of one of the columns and operable to activate the multiplexing switches of those cells, (ii) a number of readlines, each of the readlines connecting cells of a row and operable to receive a cell output signal from a cell of that row via the cell's associated multiplexing switch, (iii) a tag compare circuit operable to receive cell output signals via each readline and to compare a cell output signal on each readline with a signal representing a bit of the target tag, (iv) a target tag line operable to sequentially deliver bits of the target tag to the tag compare circuit, (v) a hit line operable to indicate the results of comparisons made by the tag compare circuit, (vi) a data bus operable to output data from the data cache when a tag is matched to the target tag, and (vii) a controller having a control input for receiving control signals, and operable to activate the bit-select lines and to generate a readout signal to activate the data cache such that data associated with a matched tag may be accessed.

* * * * *

UNITED STATES PATENT AND TRADEMARK OFFICE
CERTIFICATE OF CORRECTION

PATENT NO.   : 6,215,685 B1
DATED        : April 10, 2001
INVENTOR(S)  : Pak Kuen Fung, Heip Van Tran It is certified that error appears in the above-identified patent and that said Letters Patent is hereby corrected as shown below:

<u>Title page,</u>
Please insert the following after "Related U.S. Application Data":

Provisional application No. 60/067,293 November 26, 1997

Signed and Sealed this

Twenty-sixth Day of March, 2002

*Attest:*

JAMES E. ROGAN
*Attesting Officer*   *Director of the United States Patent and Trademark Office*